United States Patent
Cha et al.

(10) Patent No.: US 7,332,409 B2
(45) Date of Patent: Feb. 19, 2008

(54) METHODS OF FORMING TRENCH ISOLATION LAYERS USING HIGH DENSITY PLASMA CHEMICAL VAPOR DEPOSITION

(75) Inventors: Yong-Won Cha, Gyeonggi (KR); Kyu-Tae Na, Seoul (KR); Yong-Soon Choi, Seoul (KR); Eunkee Hong, Gyeonggi-do (KR); Ju-Seon Goo, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 70 days.

(21) Appl. No.: 11/149,307

(22) Filed: Jun. 9, 2005

(65) Prior Publication Data

US 2005/0277265 A1 Dec. 15, 2005

(30) Foreign Application Priority Data

Jun. 11, 2004 (KR) ...................... 10-2004-0043172
Nov. 18, 2004 (KR) ...................... 10-2004-0094758

(51) Int. Cl.
*H01L 21/76* (2006.01)
(52) U.S. Cl. ...................... 438/435; 438/436; 438/437; 438/702; 438/782; 438/788
(58) Field of Classification Search ................ 438/221, 438/296, 59, 424, 435–437, 702, 788, 359
See application file for complete search history.

(56) References Cited

U.S. PATENT DOCUMENTS

| 6,566,229 | B2 | 5/2003 | Hong et al. | 438/435 |
| 6,596,654 | B1* | 7/2003 | Bayman et al. | 438/788 |
| 6,683,354 | B2 | 1/2004 | Heo et al. | 257/397 |
| 6,737,333 | B2 | 5/2004 | Chen et al. | 438/424 |
| 6,737,334 | B2* | 5/2004 | Ho et al. | 438/424 |
| 2005/0095872 | A1* | 5/2005 | Belyansky et al. | 438/778 |
| 2005/0136686 | A1* | 6/2005 | Kim et al. | 438/778 |

FOREIGN PATENT DOCUMENTS

| JP | 2001-319968 | 11/2001 |
| JP | 2003-031650 | 1/2003 |
| KR | 1020030003542 | 1/2003 |
| KR | 1020030071710 | 9/2003 |
| KR | 1020040049739 | 6/2004 |
| KR | 1020040055389 | 6/2004 |

* cited by examiner

*Primary Examiner*—Zandra V. Smith
*Assistant Examiner*—Toniae M Thomas
(74) *Attorney, Agent, or Firm*—Myers Bigel Sibley & Sajovec, P.A.

(57) ABSTRACT

A method of forming a trench isolation layer can include forming an isolation layer in a trench using High Density Plasma Chemical Vapor Deposition (HDPCVD) with a carrier gas comprising hydrogen. Other methods are disclosed.

13 Claims, 6 Drawing Sheets

METHODS OF FORMING TRENCH ISOLATION LAYERS USING HIGH DENSITY PLASMA CHEMICAL VAPOR DEPOSITION

CROSS-REFERENCE TO RELATED APPLICATIONS

This application claims priority from Korean Patent Application Nos. 2004-0043172 and 2004-0094758, filed Jun. 11, 2004 and Nov. 18, 2004, the disclosures of which are incorporated herein by reference in their entireties.

FIELD OF THE INVENTION

The present invention relates to methods of forming semiconductor devices, and more particularly, to methods of forming trench isolation layers of semiconductor devices.

BACKGROUND

Trench isolation techniques may be used in the fabrication of semiconductor devices to address what is commonly referred to as "bird's beak" associated with conventional local oxidation of silicon (LOCOS) processes. For example, trench isolation techniques can be used to provide isolation and insulation structures between circuits to define an active region. As the level of integration in semiconductor devices increases, trench widths may be decreased, which may increase the aspect ratio of the trenches. High aspect ratio trenches may be difficult to fill without forming voids.

FIGS. 1 to 3 are sectional views illustrating a method of forming a conventional trench isolation layer. Referring to FIG. 1, a pad oxide layer and a pad nitride layer can be sequentially formed on a semiconductor substrate 1. The pad nitride layer and the pad oxide layer may be sequentially patterned, thereby forming a pad oxide layer pattern 3 and a pad nitride layer pattern 5 exposing a predetermined portion of the semiconductor substrate.

Using the pad nitride layer pattern 5 as an etch mask, the exposed semiconductor substrate 1 may be etched, thereby forming a trench defining an active region. A thermal oxide layer (not shown) and a silicon nitride layer (not shown) may be sequentially formed on inner walls of the trench. Then, a trench isolation layer 13 filling the trench can be formed on the overall surface of the semiconductor substrate 1 having the silicon nitride layer. The trench isolation layer 13 can be formed using a high density plasma chemical vapor deposition (HDPCVD) technique. The HDPCVD technique can include a deposition process and a sputtering etch process, which may be alternately and repeatedly performed. In the deposition process, an oxide layer can be formed on a bottom and sidewalls of the trench. In the sputtering etch process, the oxide layer can be sputtered and portions thereof removed (or peeled off) from the sidewalls of the trench. As shown in FIG. 1, if the width W1 of the trench is relatively wide, the oxide layer deposited on the opposite sidewalls can be uniformly formed on the overall sidewalls.

Referring to FIG. 2, a trench is formed with a relatively narrow width W2 in order to increase the level of integration of the semiconductor device. The trench having the width W2 has a higher aspect ratio relative to the trench having the width W1. In forming the trench of FIG. 2, the oxide layer can be sputtered and peeled off from an upper portion A of a sidewall of the trench (during the sputtering etch process) but may be deposited again on an upper portion B of the opposite sidewall. In the same way, the oxide layer sputtered and peeled off from portion B can be deposited on the portion A. As a result, an overhang phenomenon may occur, in which the upper portion of the trench becomes narrower than the lower portion thereof.

Referring to FIG. 3, in the case of forming the trench isolation layer 13 on the trench having the narrow width W2 using the HDPCVD technique, the upper sidewalls of the trench meet before the lower portions of the trench are filled because the sputtered oxide layer is re-deposited on the opposing upper portions A/B of the sidewalls. As a result, the trench isolation layer 13, inside the trench having the narrow width W2, may be formed with a void, which may deteriorate the insulation characteristics of the trench isolation layer.

Another method of forming a trench isolation layer is discussed in U.S. Pat. No. 6,737,333 B2, entitled Semiconductor Device Isolation Structure And Method Of Forming to Chen, et. al. According to Chen, et. al, a first oxide layer pattern and a hard mask pattern are sequentially formed on a semiconductor substrate. Using the first oxide layer pattern and the hard mask pattern as etch masks, the semiconductor substrate is etched, thereby forming a trench. A second oxide layer is formed to cover inner walls of the trench. A spin-on-glass (SOG) layer is formed inside the trench having the second oxide layer. The SOG layer is etched, to recess the SOG layer below a surface of the semiconductor substrate. A third oxide layer is formed on the recessed SOG layer.

The second oxide layer can be formed using a thermal oxidation technique, a chemical vapor deposition technique, a high density plasma chemical vapor deposition technique or an atomic layer deposition technique. The high density plasma chemical vapor deposition technique may be used because of its advantage of mass production, but the overhang phenomenon discussed may occur when this approach is used to form materials in trenches having high aspect ratios as described in reference to FIG. 2. Further, the SOG layer may be formed by coating the semiconductor substrate with an SOG material to fill the inside of the trench having the second oxide layer. The overhang phenomenon may interfere with the flow of the SOG material during the coating process. That is, when the upper portion of the second oxide layer protrudes due to the overhang phenomenon, it may be difficult to completely fill the inside of the trench with the SOG material. Further, the SOG material may be classified into an organic SOG material and an inorganic SOG material, and has various kinds. The electrical characteristics of SOG layers may vary widely depending on the type of SOG material used.

SUMMARY

Embodiments according to the invention may provide methods of forming trench isolation layers using high density plasma chemical vapor deposition. Pursuant to these embodiments, a method of forming a trench isolation layer can include forming an isolation layer in a trench using High Density Plasma Chemical Vapor Deposition (HDPCVD) with a carrier gas comprising hydrogen.

In some embodiments according to the invention, forming an isolation layer further includes forming a plasma of silane and oxygen with the hydrogen to form the isolation layer comprising silicon oxide in the trench. In some embodiments according to the invention, forming the plasma further includes applying a power of about 500 Watts to about 5000 Watts to an upper electrode of a processing chamber, a power of about 500 Watts to about 5000 Watts to a side electrode of the processing chamber, and/or a power of about 500 Watts to about 5000 Watts on bias to the processing chamber.

In some embodiments according to the invention, forming the plasma further includes providing the silane to the processing chamber at a rate of about 5 sccm to about 200 sccm and providing the oxygen to the processing chamber at a rate of about 10 sccm to about 200 sccm. In some embodiments according to the invention, forming the plasma further includes providing the hydrogen to a processing chamber in which the plasma is formed at a rate of about 1 sccm to about 2000 sccm.

In some embodiments according to the invention, forming the plasma further includes applying a power of about 500 Watts to about 5000 Watts to an upper electrode of the processing chamber, a power of about 500 Watts to about 5000 Watts to a side electrode of the processing chamber, and/or a power of about 500 Watts to about 5000 Watts on bias to the processing chamber. The silane is provided to the processing chamber at a rate of about 5 sccm to about 200 sccm. The oxygen is provided to the processing chamber at a rate of about 10 sccm to about 200 sccm.

In some embodiments according to the invention, the method further includes alternatingly forming the plasma with etch sputtering the isolation layer in the trench to form the isolation layer to a thickness about 1% to about 40% of a width of trench. In some embodiments according to the invention, the method further includes forming a second isolation layer on the first isolation layer in the trench. The first and second isolation layers are heated at a processing chamber temperature of about 50 degrees Centigrade to about 350 degrees Centigrade at least once at a processing chamber temperature of about 50 degrees Centigrade to about 350 degrees Centigrade in an oxidant and an inert gas environment or a vacuum in the processing chamber. The first and second isolation layers are thermally annealed at a processing chamber temperature of about 600 degrees Centigrade to about 1200 degrees Centigrade for a time of about 10 minutes to about 120 minutes in a oxygen, hydrogen, nitrogen, and/or water environment.

In some embodiments according to the invention, the method further includes etching back the second isolation layer to form an upper surface thereof that is below an opening of the trench. In some embodiments according to the invention, the method further includes forming a third isolation layer on the second isolation layer inside the trench using a HDPCVD process with Ar, He, and/or H as the carrier gas.

In some embodiments according to the invention, a method of forming a trench isolation layer can include forming a first isolation layer in a trench using High Density Plasma Chemical Vapor Deposition (HDPCVD) to provide a first step in a stepped sidewall profile so that a width of at a bottom of the recess is less than a width at an opening of the recess. A second isolation layer is formed in the recess on the first isolation layer to provide a second step in the stepped sidewall profile beneath the first step so that the stepped sidewall profile provides a reduced aspect ratio for the recess.

In some embodiments according to the invention, the method further includes forming a third isolation layer in the recess having the reduced aspect ratio. In some embodiments according to the invention, forming a first isolation layer in a trench using High Density Plasma Chemical Vapor Deposition includes forming the first isolation layer in a trench using HDPCVD, wherein a carrier gas comprises hydrogen.

DESCRIPTION OF EMBODIMENTS ACCORDING TO THE INVENTION

Figure 1:
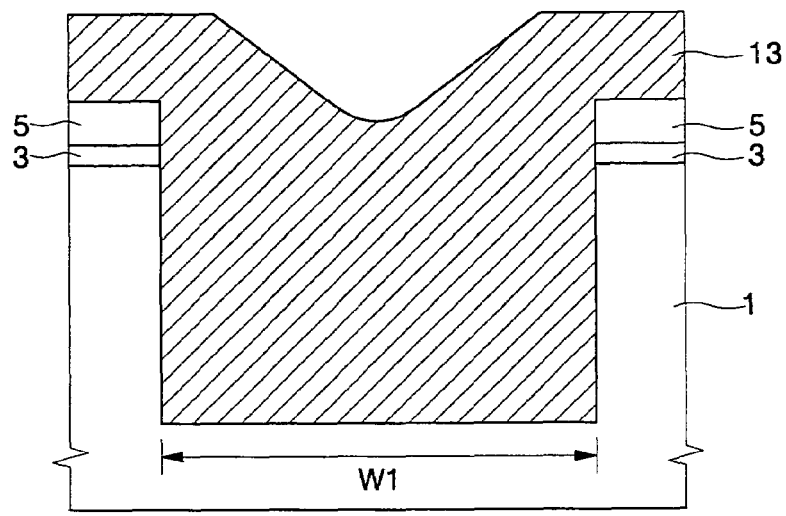
FIGS. 1 to 3 are sectional views illustrating a method of forming a conventional trench isolation layer.
Figure 2:
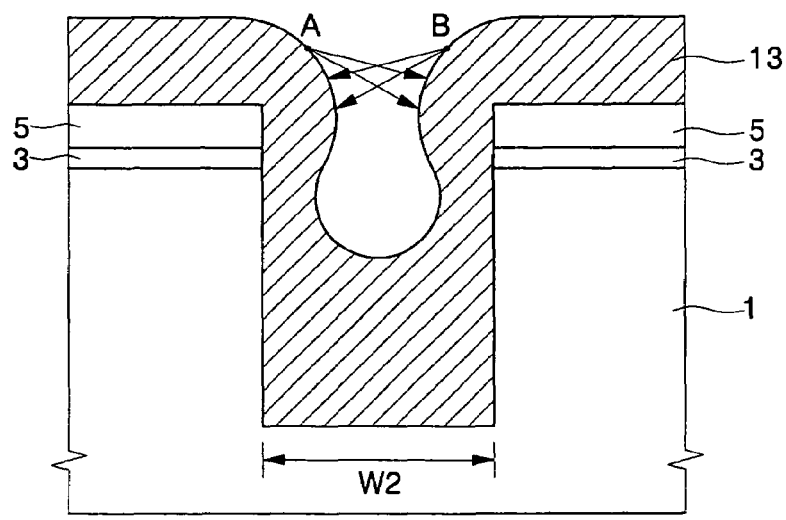
Figure 3:
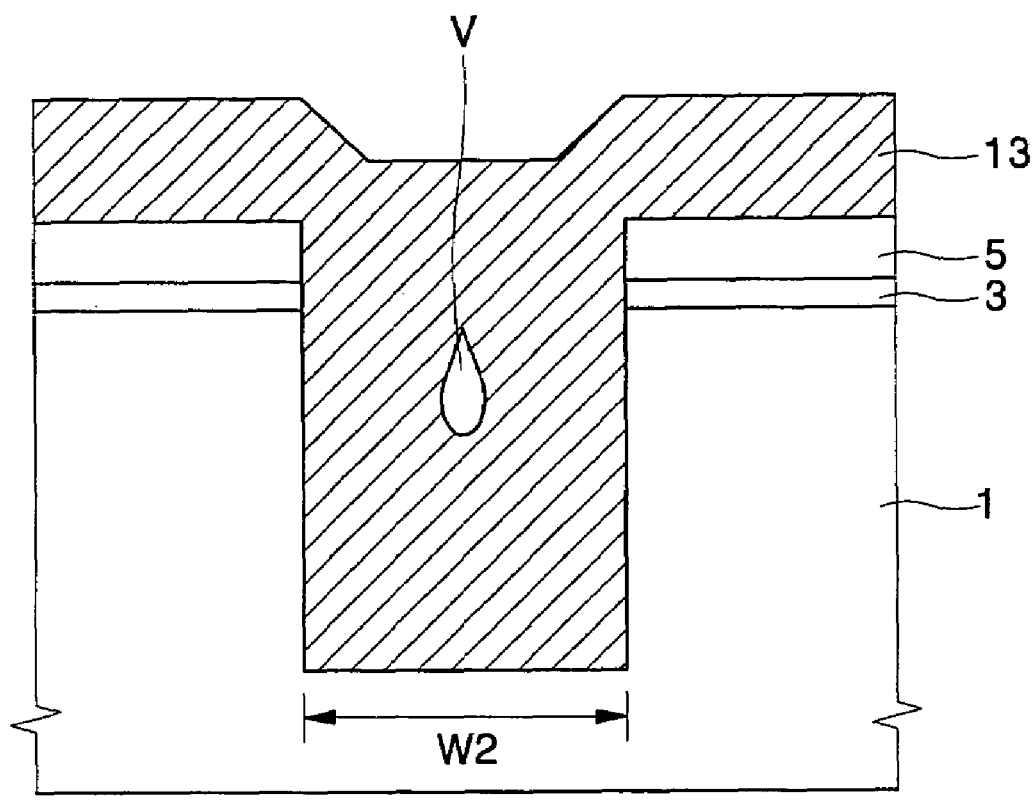

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements. The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 4:
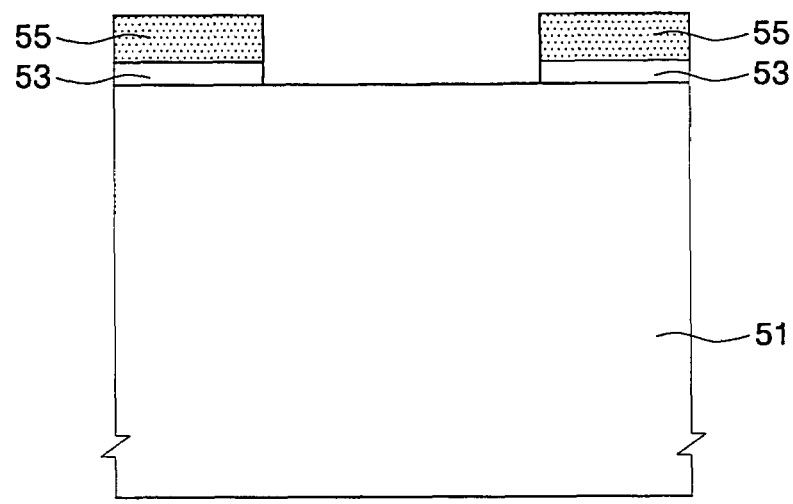
FIGS. 4 to 10 are sectional views illustrating methods of forming trench isolation layers according to some embodiments of the present invention.

FIGS. 4 to 10 are sectional views illustrating methods of forming trench isolation layers according to some embodiments of the present invention. Referring to FIG. 4, a pad oxide layer and a hard mask layer are formed on a semiconductor substrate 51. In some embodiments according to the invention, the pad oxide layer is formed of a thermal oxide layer. The pad oxide layer may be formed to alleviate a stress due to a difference between thermal expansion coefficients of the semiconductor substrate 51 and the hard mask layer. In some embodiments according to the invention, the hard mask layer is formed of a material layer having an etch selectivity with respect to the semiconductor substrate 51. For example, the hard mask layer may be formed of a silicon nitride layer using a Chemical Vapor Deposition (CVD) technique. The hard mask layer and the pad oxide layer are patterned, thereby exposing a predetermined portion of the semiconductor substrate 51, and forming a pad oxide layer pattern 53 and a hard mask pattern 55. The patterning may include forming a photoresist layer on the hard mask layer, and exposing a predetermined region of the semiconductor substrate 51, using photolithography and etching processes.

Figure 5:
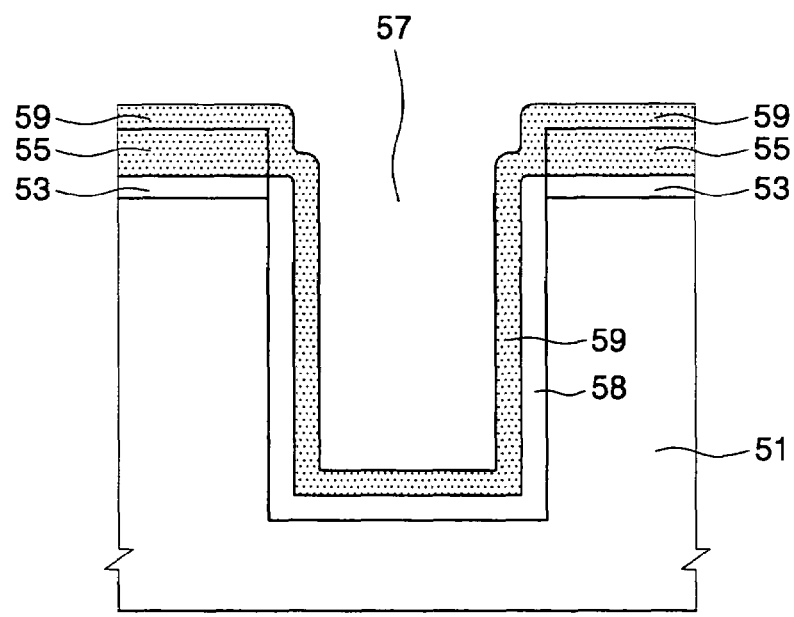

Referring to FIG. 5, the exposed semiconductor substrate 51 is anisotropically etched, using the hard mask pattern 55 as an etch mask, thereby forming a trench 57 defining active regions. The trench 57 may be formed to have various shapes, such as a reverse trapezoid shape, in which its upper width is greater than its lower width, a trapezoid shape, in which its upper width is less than its lower width, or a square shape, in which its upper width is equal to its lower width. For convenience, the trench 57 is described hereinafter as having a square shape, but it will be understood that the trench 57 may have other shapes as described above.

In some embodiments according to the invention, a first trench liner 58 is formed to cover inner walls of the trench 57. The first trench liner 58 may be formed of an insulating layer, using a thermal oxidation method or an ALD technique. For example, the first trench liner 58 may be formed of a silicon oxide layer by the thermal oxidation. In some embodiments according to the invention, a second trench liner 59 is also formed on inner walls of the trench 57 having the first trench liner 58. For example, the second trench liner 59 may be formed of a silicon nitride layer using a CVD technique. In some embodiments according to the invention, the second trench liner 59 may be omitted. In some embodiments according to the invention, the first trench liner 58 and the second trench liner 59 may be omitted.

Figure 6:
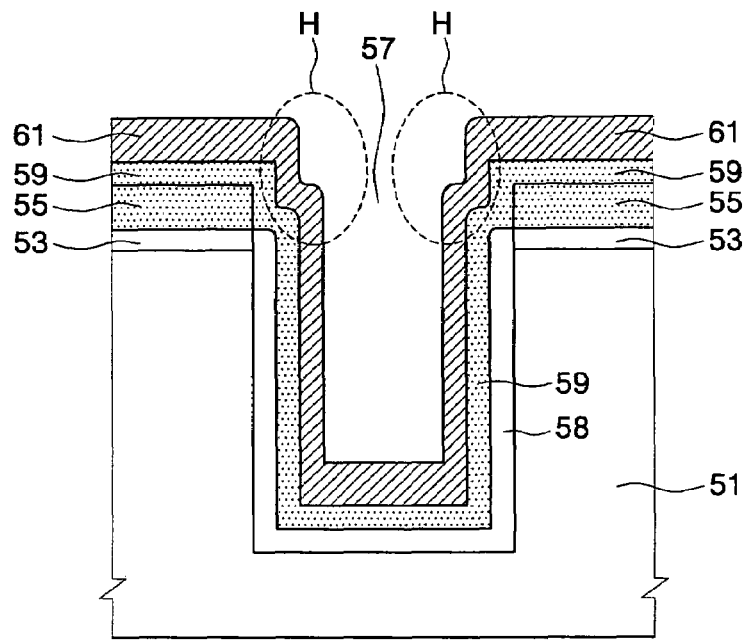

Referring to FIG. 6, a first isolation layer 61 is formed on inner walls of the trench 57 having the second trench liner 59, by a High Density Plasma Chemical Vapor Deposition (HDPCVD) technique with hydrogen. In some embodiments according to the invention, where the first trench liner 58 and the second trench liner 59 are absent, the first isolation layer 61 may be formed to directly contact the inner walls of the trench 57. For example, in some embodiments according to the invention, the first isolation layer 61 may be formed of a silicon oxide layer, by the HDPCVD technique using hydrogen as a carrier gas.

In some embodiments according to the invention, the HDPCVD technique may be carried out using hydrogen by loading the semiconductor substrate 51 into the reactor, applying a plasma power to the reactor, and introducing a reactant gas and the carrier gas into the reactor. The plasma power may be applied under the condition of 500 to 5000 W at an upper electrode, of 500 to 5000 W at a side electrode, and of 500 to 5000 W on bias. In some embodiments according to the invention, the reactant gases may be, for example, silane ($SiH_4$) and oxygen ($O_2$). The silane ($SiH_4$) may be supplied at a flow rate of about 5 sccm to about 200 sccm, and the oxygen ($O_2$) may be supplied at a flow rate of about 10 sccm to about 200 sccm. As described above, in some embodiments according to the invention, the carrier gas can be hydrogen.

The reactant gases react each other to create a high density plasma which heats the substrate to a high temperature and forms a silicon oxide layer thereon. The deposition process can be interspersed with a sputtering etch process, which are alternately and repeatedly performed to produce the silicon oxide on the substrate 51. During the deposition process, the silicon oxide layer is formed on a bottom and on the sidewalls of the trench 57. In some embodiments according to the invention, a flow rate of the hydrogen gas to the processing chamber is controlled at a rate of about 1 to about 2000 sccm, to reduce the generation of an overhang (i.e., to reduce the formation of the silicon oxide layer on the upper portions H of the trench 57 which may otherwise reach the opposite sidewall of the trench 57 to produce a void). Accordingly, the silicon oxide layer is sputtered and peeled off the sidewalls of the trench 57 during the sputtering etch process and the flow rate of the hydrogen gas is sufficient to reduce the overhang phenomenon to avoid the formation of a void in the first isolation layer 61.

In some conventional approaches, the carrier gas used for HDPCVD may be helium (He) or argon (Ar). However, as appreciated by the present inventors, when helium or argon are used as a carrier gas to form an isolation layer in a high aspect ratio trench, the carrier gases may not sufficiently reduce generation of the overhang phenomenon, so that the silicon oxide layer formed on the upper portions H of the trench 57 may be thicker than that of the silicon oxide layer formed on the lower portion of the trench 57.

Figure 8:
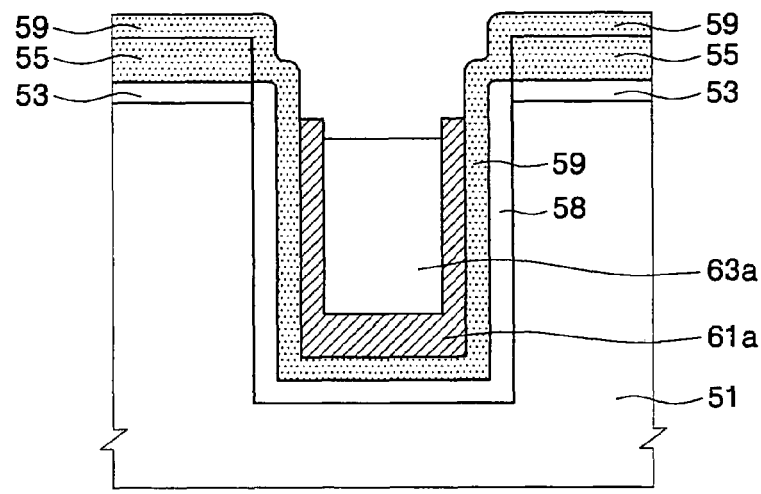

In some embodiments according to the invention, the first isolation layer 61 in the trench 57 (formed using HDPCVD) provides a first step in a stepped sidewall profile so that a width of at a bottom of the recess is less than a width at an opening of the recess as shown in FIG. 6. In further embodiments according to the invention, a second isolation layer 63 can be formed in the recess on the first isolation layer 61 to provide a second step in the stepped sidewall profile beneath the first step so that the stepped sidewall profile provides a reduced aspect ratio for the recess, as shown in FIG. 8.

In some embodiments according to the invention, the first isolation layer 61 is formed to cover the semiconductor substrate 51 as well as the inner walls of the trench 57, and the first isolation layer 61 may be formed with a thickness of about 1% to about 40% the width of the trench 57.

Figure 7:
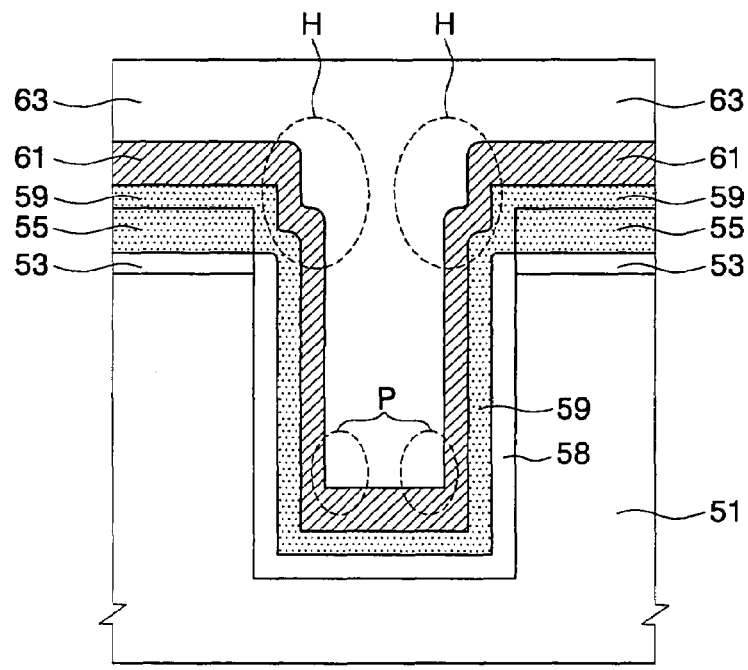

Referring to FIG. 7, a polysilazane group of SOG material is formed on the semiconductor substrate 51 having the first isolation layer 61 by coating, thereby forming a second isolation layer 63. The semiconductor substrate having the second isolation layer is pre-baked at least one time at in an environment (i.e., the ambient temperature in the processing chamber) at a temperature of about 50 to about 350° C., and a particle and contamination removal process is performed. The particle and contamination removal process may be performed at a temperature of about 50 to about 350° C. for about 10 to about 120 minutes in an atmosphere of supplied oxidant and an inert gas, or in a vacuum atmosphere.

A thermal anneal process is performed at a temperature of about 600 to abut 1200° C., in an atmosphere of at least oxygen ($O_2$), hydrogen ($H_2$), nitrogen ($N_2$), and/or water ($H_2O$), for about 10 to about 120 minutes.

In some embodiments according to the invention, the second isolation layer 63 may have a porous layer formed on lower corner portions P of the trench 57 due to the property of the SOG material. Even though the porous layer may be formed on the lower corner portions P, adequate insulation characteristics can be maintained as the second isolation layer 63 is surrounded by the first isolation layer 61. Further, the polysilazane group of SOG material such as TOSZ (product name of hydropolysilazane) has electrical and burial characteristics comparable to other SOG materials.

Referring to FIG. 8, an etch-back process is performed on the second isolation layer 63 to etch the second isolation layer 63 until it is recessed lower than an upper interface of the active region, thereby forming a second isolation pattern 63a. The etch-back process may be performed using a dry etch or a wet etch method. In some embodiments according to the invention, the dry etch method may use etch conditions including CFx or CHxFy. In some embodiments according to the invention, the wet etch method may use a wet etch solution including hydro fluoric acid (HF).

During the etch process to form the second isolation layer 63, the first isolation layer 61 may also be etched, thereby forming a first isolation pattern 61a. The polysilazane group of SOG layer has a higher etch rate than that of the silicon oxide layer formed by the HDPCVD technique with hydrogen. That is, the second isolation layer 63 is etched more rapidly than the first isolation layer 61. Therefore, the second isolation pattern 63a is recessed below an upper surface of the first isolation pattern 61a. As a result, the second isolation pattern 63a inside the trench 57 has an upper surface lower than the surface of the active region, and the first isolation pattern 61a inside the trench 57 has an upper surface higher than the surface of the second isolation pattern 63a.

Figure 9:
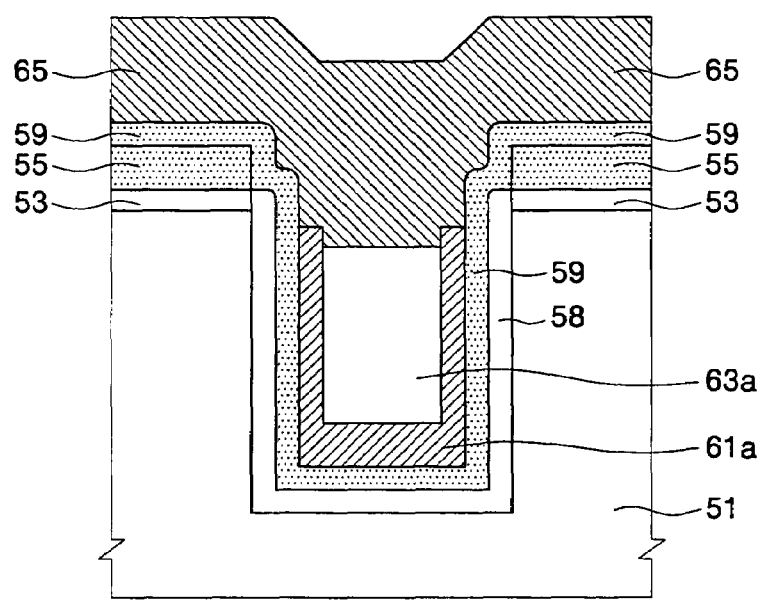

Referring to FIG. 9, a third isolation layer 65 is formed on the overall surface of the semiconductor substrate 51 having the first isolation pattern 61a and the second isolation pattern 63a. The third isolation layer 65 may be formed of a high density plasma oxide layer.

Specifically, the high density plasma oxide layer may be formed using a HDPCVD processing using a carrier gas. The HDPCVD process may be carried out by loading the semiconductor substrate 51 into the processing chamber, applying power to a plasma generator, and introducing a reactant gas and the carrier gas into the processing chamber. The reactant gas may use, for example, silane ($SiH_4$) and oxygen ($O_2$). The silane ($SiH_4$) may be supplied at a flow rate of about 5 sccm to about 200 sccm, and the oxygen ($O_2$) may be supplied at a flow rate of about 10 sccm to about 200 sccm.

The trench 57 having the first isolation pattern 61a and the second isolation pattern 63a has a small aspect ratio (compared to the aspect ratio of the trench 57. Therefore, the carrier gas may use helium (He), argon (Ar), or hydrogen (H). That is, even if helium (He) or argon (Ar) are used as the carrier gas to form the third isolation layer 65, the likelihood of an overhang being formed is low as the aspect ratio of the trench has been reduced by, for example, the first isolation layer 61a (to reduce the width) and the second isolation pattern 63a (to reduce the depth and the width). The hydrogen (H) gas may be supplied at a flow rate of 1 to 2000 sccm. The helium (He) gas may be supplied at a flow rate of about 1 sccm to about 1000 sccm. The argon (Ar) gas may be supplied at a flow rate of about 1 sccm to about 1000 sccm.

Figure 10:
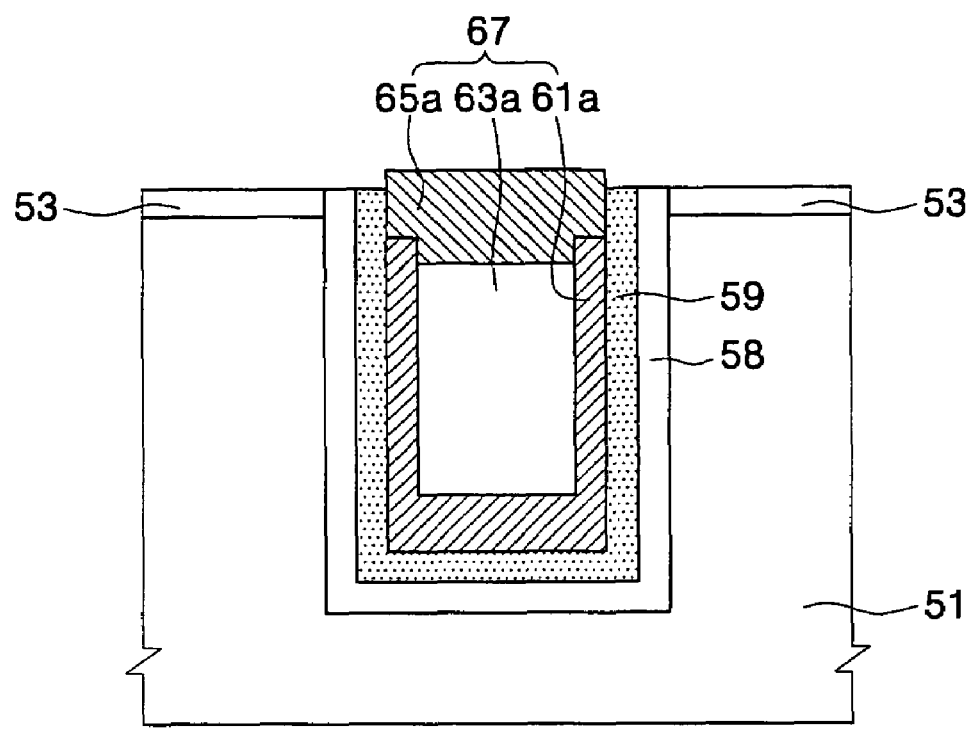

Referring to FIG. 10, the third isolation layer 65 is planarized, thereby forming a third isolation pattern 65a. The planarization process may use a chemical mechanical polishing (CMP) process employing the hard mask pattern 55 as a stop layer. Then, the hard mask pattern 55 is removed. As a result, the second isolation pattern 63a, the first isolation pattern 61a surrounding a bottom and sidewalls of the second isolation pattern 63a, and the third isolation pattern 65a covering an upper surface of the second isolation pattern 63a provide a trench isolation layer 67 inside the trench 57.

As described above, the SOG layer is formed by spin-coating the semiconductor substrate 51 with a liquid state of a film material, and hardening the film material. The SOG layer formed may be porous. Further, the high density plasma oxide layer may be denser than the SOG layer. Therefore, the trench isolation layer 67 formed inside the trench 57 provides a very excellent insulation characteristics because it is formed such that the SOG layer is completely surrounded by the high density plasma oxide layer.

As described above, according to the present invention, inside the trench is formed the trench isolation layer structured to include the second isolation pattern, the first isolation pattern surrounding a bottom and sidewalls of the second isolation pattern, and the third isolation pattern covering an upper surface of the second isolation pattern. Further, the first isolation pattern and the third isolation pattern are formed of a high density plasma oxide layer. The second isolation pattern is formed of a polysilazane group of SOG layer. Therefore, the present invention provides a structure of the trench isolation layer, which is formed such that the SOG layer having an excellent gap filling characteristics but having a porous layer property, is completely surrounded by the high density plasma oxide layer, thereby improving isolation characteristics of the structure without any voids inside the trench.

What is claimed:

1. A method of forming a trench isolation layer comprising:
    forming a first isolation layer in a trench using High Density Plasma Chemical Vapor Deposition (HDPCVD) with a carrier gas comprising hydrogen;
    forming a second isolation layer on the first isolation layer in the trench;
    heating the first and second isolation layers at a processing chamber temperature of about 50 degrees Centigrade to about 350 degrees Centigrade at least once at a processing chamber temperature of about 50 degrees Centigrade to about 350 degrees Centigrade in an oxidant and an inert gas environment or a vacuum in the processing chamber; and
    thermally annealing the first and second isolation layers at a processing chamber temperature of about 600 degrees Centigrade to about 1200 degrees Centigrade for a time of about 10 minutes to about 120 minutes in a oxygen, hydrogen, nitrogen, and/or water environment.

2. A method according to claim 1 further comprising:
    etching back the second isolation layer to form an upper surface thereof that is below an opening of the trench.

3. A method according to claim 2 further comprising:
    forming a third isolation layer on the second isolation layer inside the trench using a HDPCVD process with Ar, He, and/or H as the carrier gas.

4. A method of forming a trench isolation layer comprising:
    preparing a semiconductor substrate;
    selectively etching a predetermined portion of the semiconductor substrate, thereby forming a trench defining an active region;
    forming a first isolation layer covering inner walls of the trench using a high density plasma chemical vapor deposition technique with hydrogen;
    forming a second isolation layer by coating the semiconductor substrate having the first isolation layer with a polysilazane group of SOG material;
    etching the second isolation layer and the first isolation layer, thereby forming a second isolation pattern having an upper surface lower than a surface of the active region and a first isolation pattern having an upper surface higher than a surface of the second isolation pattern inside the trench; and
    forming a third isolation pattern covering upper surfaces of the first isolation pattern and the second isolation pattern.

5. The method according to claim 4, after forming the trench, further comprising forming a first trench liner covering inner walls of the trench.

6. The method according to claim 5, wherein the first trench liner is formed of an insulating layer using a thermal oxidation technique or an atomic layer deposition technique.

7. The method according to claim 5, further comprising forming a second trench liner on inner walls of the trench having the first trench liner.

8. The method according to claim 7, wherein the second trench liner is formed of a silicon nitride layer.

9. The method according to claim 4, wherein the high density plasma chemical vapor deposition technique with hydrogen uses hydrogen as a carrier gas, and a flow rate of the hydrogen is in the range of 1 to 2000 sccm.

10. The method according to claim 4, wherein the high density plasma chemical vapor deposition technique with hydrogen uses silane ($SiH_4$) and oxygen ($O_2$) as reactant gases, and a flow rate of silane ($SiH_4$) is in the range of 5 to 200 sccm, and a flow rate of oxygen ($O_2$) is in the range of 10 to 200 sccm.

11. A method of forming a recess isolation layer comprising:
    forming a first isolation layer in a trench using High Density Plasma Chemical Vapor Deposition (HDPCVD) to provide a first step in a stepped sidewall profile so that a width of at a bottom of the recess is less than a width at an opening of the recess; and forming a second isolation layer in the recess on the first isolation layer to provide a second step in the stepped sidewall profile beneath the first step so that the stepped sidewall profile provides a reduced aspect ratio for the recess.

12. A method according to claim 11 further comprising:
    forming a third isolation layer in the recess having the reduced aspect ratio.

13. A method according to claim 11 wherein forming a first isolation layer in a recess using High Density Plasma Chemical Vapor Deposition comprises forming the first isolation layer in a recess using HDPCVD, wherein a carrier gas comprises hydrogen.

* * * * *